(12) United States Patent
Landmann (10) Patent No.: US 9,673,801 B2
(45) Date of Patent: Jun. 6, 2017

(54) THREE-LEAD ELECTRONIC SWITCH SYSTEM ADAPTED TO REPLACE A MECHANICAL SWITCH

(71) Applicant: Kulite Semiconductor Products, Inc., Leonia, NJ (US)

(72) Inventor: Wolf S. Landmann, Fair Lawn, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 495 days.

(21) Appl. No.: 14/447,733

(22) Filed: Jul. 31, 2014

(65) Prior Publication Data

US 2015/0035383 A1   Feb. 5, 2015

Related U.S. Application Data

(60) Provisional application No. 61/860,855, filed on Jul. 31, 2013.

(51) Int. Cl.
*H02H 7/00* (2006.01)
*H03K 17/082* (2006.01)

(52) U.S. Cl.
CPC ........ *H03K 17/0822* (2013.01); *Y10T 307/76* (2015.04)

(58) Field of Classification Search
CPC .................................................. H03K 17/0822
USPC ....................................................... 361/93.1
See application file for complete search history.

(56) References Cited

U.S. PATENT DOCUMENTS

| | | | | |
|---|---|---|---|---|
| 5,306,955 A * | 4/1994 | Fryer | ............... | H03K 17/08142 250/551 |
| 6,215,634 B1 * | 4/2001 | Terasawa | .......... | H02M 3/33592 327/310 |
| 6,559,653 B2 * | 5/2003 | Macke, Sr. | ............ | H03K 17/94 324/555 |
| 7,034,700 B2 * | 4/2006 | Kurtz | ................. | H03K 17/9625 340/626 |
| 7,656,632 B2 * | 2/2010 | Tsuchihashi | ....... | H03K 17/0822 361/93.1 |
| 7,960,997 B2 * | 6/2011 | Williams | .......... | H01L 23/49575 324/762.09 |

* cited by examiner

*Primary Examiner* — Stephen W Jackson
(74) *Attorney, Agent, or Firm* — Troutman Sanders LLP; James E. Schutz; Mark Lehi Jones (57) ABSTRACT

This disclosure provides example methods, devices, and systems for a three-lead electronic switch system adapted to replace a mechanical switch. A device is disclosed that includes a sensor, a current limiting circuit, an output switching circuit comprising a first switching device and a second switching device, and a three lead interface circuit in communication with the output switching circuit and the current limiting circuit. The device includes an electronic switching circuit in communication with the sensor, the current limiting circuit, and the output switching circuit. The electronic switching circuit is configured to drive the first and second switching devices in complementary conduction states responsive to determining the output of the sensor relative to a threshold voltage. The output switching circuit includes a first terminal, a second terminal, and a return terminal that are configured to provide power to the electronic switching circuit while providing an indication of the conduction states.

22 Claims, 5 Drawing Sheets

THREE-LEAD ELECTRONIC SWITCH SYSTEM ADAPTED TO REPLACE A MECHANICAL SWITCH

RELATED APPLICATIONS

This application is related to U.S. Provisional Patent Application Ser. No. 61/860,855, filed of Jul. 31, 2013, entitled: "Three-Lead Electronic Switch System Adapted to Replace a Mechanical Switch," the contents of which are hereby incorporated by reference in their entirety as if presented herein in full.

TECHNICAL FIELD

This disclosure generally relates to switches and more particularly to a three-lead electronic switch system adapted to replace a mechanical switch.

BACKGROUND

Mechanical switches may be used to, for instance, indicate whether an environmental condition such as pressure, temperature or linear displacement is above or below a predetermined threshold. Further, the mechanical switch may be coupled to, for instance, a visual indicator associated with an environmental condition or a mechanical relay or a logical input associated with a control device.

Mechanical switches have been used in electromechanical devices for many years. Unfortunately, they have many shortcomings. For instance, mechanical switches are limited by their mechanical construction. Among other things, mechanical switches are known to provide poor reliability, poor stability, limited operational lifespan, relatively low accuracy, contact degradation, undefined hysteresis, and limited sensitivity to vibration shock, particularly when compared with electronic switches.

Unlike the mechanical construction of mechanical switches, electronic switches use solid-state technology and do not have the same restrictions or limitations that mechanical switches have. In many instances, electronic switches improve the limitations of mechanical switches, e.g., improving operational life, by several orders of magnitude. Advantageously, electronic switches may implement functions that cannot be implemented in mechanical switches, e.g., latched output(s), multiple thresholds, timed delays, and the like.

Today, there are numerous devices that utilize mechanical switches. Unfortunately, while it may be desirable to implement an electronic switch in the place of these mechanical switches, difficulties often forbid such replacement. For example, electronic switches may require a permanent power supply for the electronics and the sensor in the switch. In some instances, designers have supplied power via an additional wire to the electronic switch. Adding a power supply wire often requires rewiring the entire system in which the switches are part. Such rewiring is often expensive and difficult.

Figure 1:
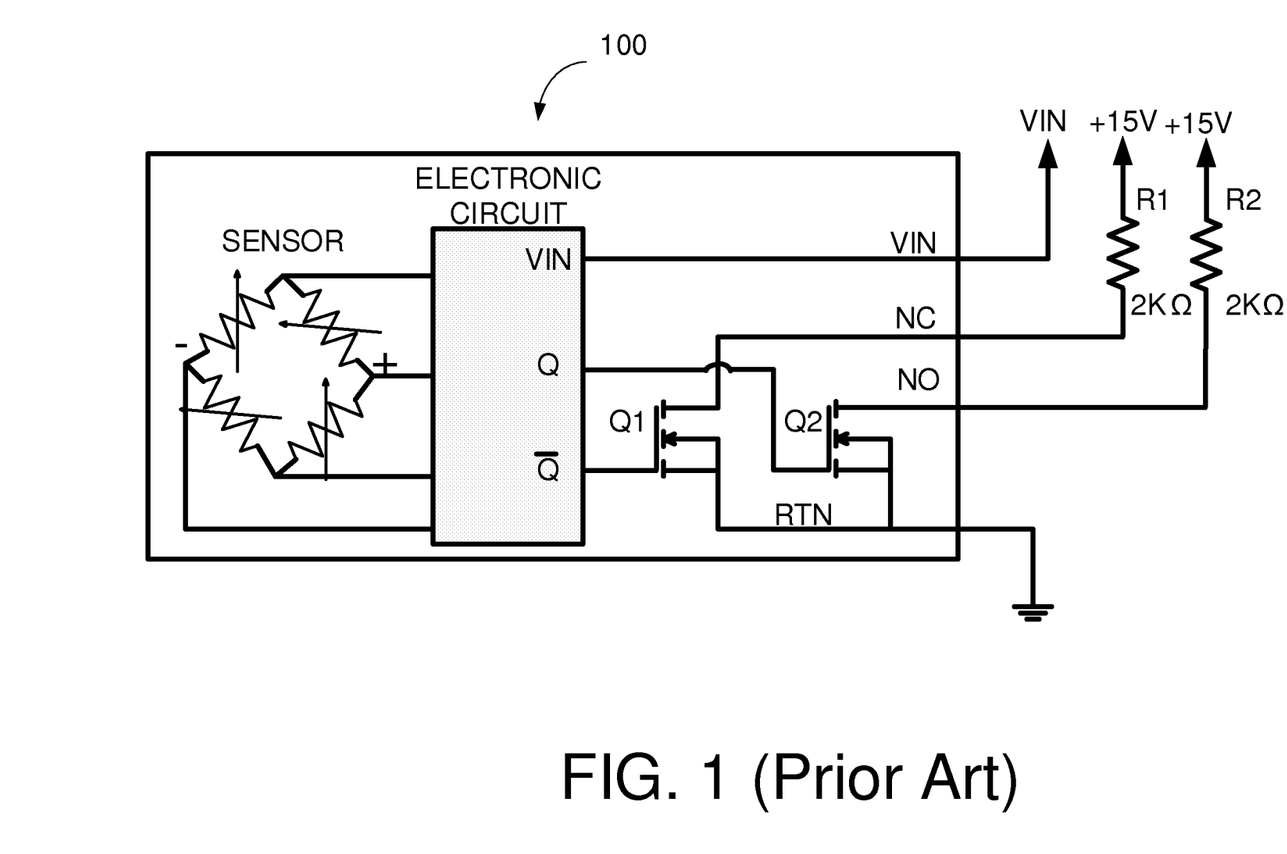
FIG. 1 illustrates a prior art electronic switch system 100 adapted to replace a mechanical switch.

FIG. 1 illustrates a prior art system 100 having a three-lead electronic switch system adapted to replace a mechanical switch. In FIG. 1, the switches are implemented using metal oxide semiconductor field effect transistors (MOSFET) and are controlled by the electronic circuit, which may evaluate the output of the sensor by comparing it to a predetermined value. While the sensor is displayed as a Wheatstone bridge in FIG. 1, other types of sensors may be used. The configuration of FIG. 1 has a disadvantage of requiring an additional connection to provide a supply voltage to the electronic circuit and the sensor. Such configuration may require additional wiring or wiring changes, which may be expensive and labor intensive. Further, such configuration may require significant logistics such as documentation of the wiring or connector changes, which may render the replacement of the mechanical switch unfeasible despite the advantages of such a replacement.

SUMMARY OF THE DISCLOSURE

Briefly described, embodiments of the present disclosure relate to a three-lead electronic switch system adapted to replace a mechanical switch. In some embodiments, the three-lead electronic switch may be used in certain applications as a direct replacement to a three-wire mechanical switch, without the need of additional wiring. For example, in an exemplary embodiment, the three-lead electronic switch may be a plug-and-play replacement for the mechanical switch, such that no additional rewiring of a system implementing the switches is necessary.

A device is disclosed that includes a sensor, a current limiting circuit, an output switching circuit comprising a first switching device and a second switching device, and a three lead interface circuit in communication with the output switching circuit and the current limiting circuit. The device includes an electronic switching circuit in communication with the sensor, the current limiting circuit, and the output switching circuit. The electronic switching circuit is configured to drive the first and second switching devices in complementary conduction states responsive to determining the output of the sensor relative to a threshold voltage. The output switching circuit includes a first terminal, a second terminal, and a return terminal that are configured to provide power to the electronic switching circuit while providing an indication of the conduction states without requiring additional wiring for powering the device.

BRIEF DESCRIPTION OF THE FIGURES

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where.

DETAILED DESCRIPTION

The following detailed description is merely illustrative in nature and is not intended to limit the present disclosure, or the application and uses of the present disclosure. Furthermore, there is no intention to be bound by any expressed or implied theory presented in the preceding field of use, background, or summary of the disclosure or the following detailed description. The present disclosure provides various examples, embodiments and the like, which may be described herein in terms of functional or logical block elements. Various techniques described herein may be used for a three-lead electronic switch system adapted to replace a mechanical switch. The various aspects described herein are presented as methods, devices (or apparatus), and systems that may include a number of components, elements, members, modules, nodes, peripherals, or the like. Further, these methods, devices, and systems may include or not include additional components, elements, members, modules, nodes, peripherals, or the like.

Throughout the specification and the claims, the following terms take at least the meanings explicitly associated herein, unless the context clearly dictates otherwise. The terms "connect," "connecting," and "connected" mean that one function, feature, structure, or characteristic is directly joined to or in communication with another function, feature, structure, or characteristic. The terms "couple," "coupling," and "coupled" mean that one function, feature, structure, or characteristic is directly or indirectly joined to or in communication with another function, feature, structure, or characteristic. Relational terms such as "first" and "second," and the like may be used solely to distinguish one entity or action from another entity or action without necessarily requiring or implying any actual such relationship or order between such entities or actions. The term "or" is intended to mean an inclusive or. Further, the terms "a," "an," and "the" are intended to mean one or more unless specified otherwise or clear from the context to be directed to a singular form. The term "include" and its various forms are intended to mean including but not limited to. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

In the following description, numerous specific details are set forth. However, it is to be understood that embodiments of the disclosed technology may be practiced without these specific details. References to "one embodiment," "an embodiment," "example embodiment," "various embodiments," and other like terms indicate that the embodiments of the disclosed technology so described may include a particular function, feature, structure, or characteristic, but not every embodiment necessarily includes the particular function, feature, structure, or characteristic. Further, repeated use of the phrase "in one embodiment" does not necessarily refer to the same embodiment, although it may.

Figure 2:
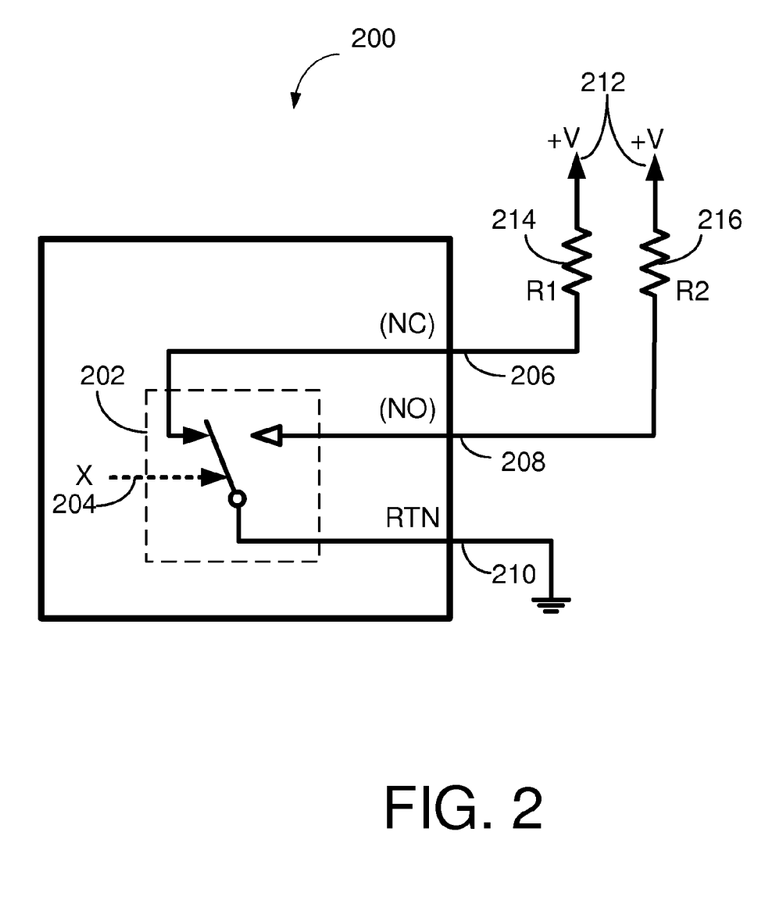
FIG. 2 is an illustration of an example three-lead electronic switch system 200 adapted to replace a mechanical switch in accordance with various aspects set forth herein.

This disclosure presents certain example embodiments of a three-lead electronic switch system adapted to replace a mechanical switch such as a single pole double throw (SPDT) switch. For example, FIG. 2 illustrates a general embodiment of a three-lead electronic switch system 200 adapted to replace a mechanical switch in accordance with various aspects set forth herein. Further, this disclosure presents a three-lead electronic switch system adapted to replace a mechanical switch that does not require additional wiring or wiring changes.

The example system 200 shown in FIG. 2 includes a representation of a single pole double throw (SPDT) switch 202 that is shown in a first position, for example, such that a current path is provided from a first terminal 206 to a ground or return terminal 210 associated with the system 200. According to certain example implementations, the position of the switch 202 depends on a level of an input X 204. For example, in the case where the input X 204 is below a given threshold, the switch 202 may remain in a first (or default) position as shown and the first terminal 206 may be referred to as a normally closed (NC) terminal. When the switch 202 is in the first position, the second terminal 208 (which may be designated as the normally open (NO) terminal) may be in an open state with no substantial current path to ground 210.

With continued reference to FIG. 2, in the case where the input X 204 is below a given threshold and the switch 202 is in the first position as shown, the current path to the ground terminal 210 from the first terminal 206 may be established, thus causing a voltage drop across the first pull-up resistor 214 of approximately the source voltage 212 (+V). This places the first terminal 206 (NC) at a low voltage state (and possibly at the ground voltage level depending on the internal resistance of the switch 202). Conversely, the voltage at the second terminal 208 (NO) is held at approximately the source voltage 212 (+V) in this case since there is no established current path to ground and no voltage drop across the second pull-up resistor 216.

In the case where the input X 204 is above a given threshold such that the switch 202 is placed in a second position (not shown), the first terminal 206 (NC) would be at approximately the source voltage 212 (+V) since there is no established current path to the ground terminal 210 and no voltage drop across the first pull-up resistor 214. However, the voltage at the second terminal 208 (NO) in this case would be at a low voltage state (and possibly at the ground voltage level depending on the internal resistance of the switch 202) due to the current path to the ground terminal 210.

In one example implementation the voltage source 212 (V+) may be 5 volts. In another example implementation the voltage source 212 (V+) may be 9 volts. In another example implementation the voltage source 212 (V+) may be 15 volts. In another example implementation the voltage source 212 (V+) may be 24 volts. In accordance with certain example implementation, the voltage source 212 (V+) may be at any voltage level as dictated by the needs of the system 200. In an example implementation, the voltage source connected to the first pull-up resistor 214 may differ from the voltage source connected to the second pull-up resistor 216.

In one example implementation the pull-up resistors R1 214 and R2 216 may be 1000 ohms. In another example implementation the pull-up resistors 214 216 may be 2200 ohms. In accordance with certain example implementation, the pull-up resistors 214 216 may be selected at any resistance as dictated by the needs of the system 200.

Figure 3:
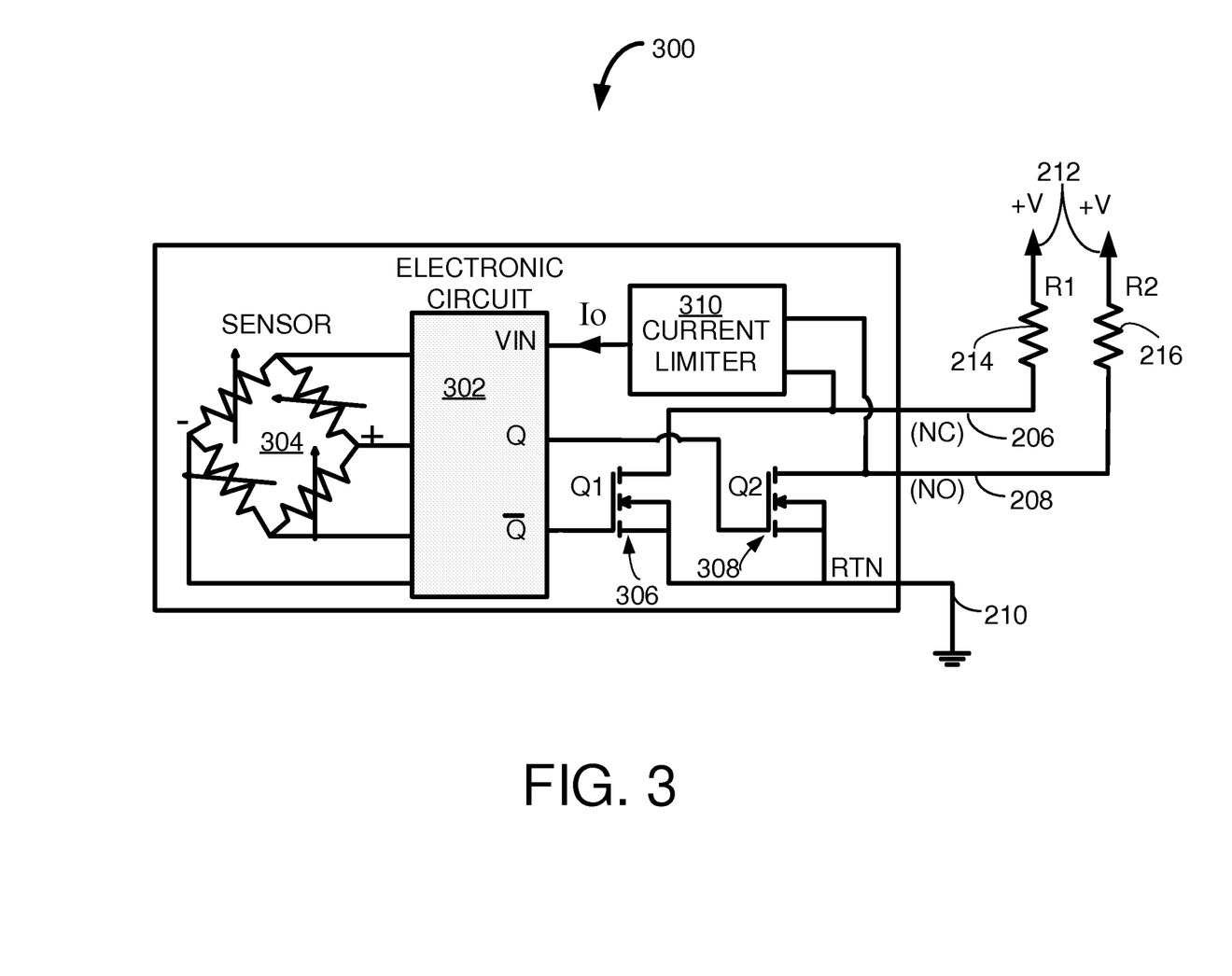
FIG. 3 illustrates an example embodiment of a three-lead electronic switch system 300 adapted to replace a mechanical switch in accordance with various aspects set forth herein.

FIG. 3 illustrates an example embodiment of a three-lead electronic switch system 300 (similar to the system 200 as described above) and adapted to replace a mechanical switch in accordance with various aspects set forth herein. In FIG. 3, the three-lead electronic switch system 300 may replace a mechanical switch while still meeting the design requirements of the system 300. While mechanical or solid state switches may have leakage currents during operation in a non-active state, typical systems may tolerate such leakage current. The three-lead electronic switch system 300, according to certain embodiments of the disclosed technology, may be adapted to replace a mechanical switch and may utilize "leakage current" to power the electronic circuit 302 and associated components (such as the sensor 304, Q1 306, Q2 308, a current limiter 310, etc.) without the need for additional wiring for a separate supply voltage input 316.

As described above with reference to FIG. 2, the system 300 may include pull-up resistors R1 214 and R2 216 that may be connected to the supply voltage (V+) 212. The pull-up resistors R1 214 and R2 216 may be utilized to provide power to the electronic circuit 302 and the associated components while also providing means for a voltage drop (based on the conduction states of Q1 306 and Q2 308) for the first (NC) terminal 206 and the second (NO) terminal 208, as discussed above with reference to FIG. 2. For example, and according to certain implementations, the electronic circuit 302 may provide complementary outputs for oppositely driving Q1 306 and Q2 308 based on a measurement threshold as detected by the sensor 304.

In an example implementation, when a measurement voltage from the sensor 304 is below a predetermined threshold, Q1 306 may be placed in a conducting state and current may flow through R1 214 resulting in a "low" voltage at the first (NC) terminal 206. Since Q2 308 may be in a non-conducting state while Q1 306 is conducting, the second (NO) terminal 208 may be in a "high" state. Conversely, when the measurement voltage from the sensor 304 is above the predetermined threshold, Q2 308 may be placed in a conducting state and current may flow through R2 216 resulting in a "low" voltage at the second (NO) terminal 208. As may be recognized by those of skill in the art, the electronic circuit 302 may be configured such that the output states associated with the first (NC) terminal 206 and the second (NO) terminal 208 may be reversed (relative to the example provided above) with respect to measurement voltage and threshold level.

In certain example implementations, the current limiter 310 may be utilized to provide power from the voltage source (V+) 212 through the pull-up resistors R1 214 and/or R2 216 to the electronic circuit 302 and the sensor 304 while limiting the current draw to the electronic circuit 302 and the sensor 304 such that the "low" and "high" states of the first (NC) terminal 206 and the second (NO) terminal 208 outputs may be controlled by the conduction states of Q1 306 and Q2 308. Furthermore, in accordance with an example implementation of the disclosed technology, the separate pull-up resistors R1 214 and R2 216 allow for uninterrupted power for the electronic circuit 302 and the sensor 304 when either Q1 306 or Q2 308 is conducting.

By way of an example, if the electronic circuit 302 and the sensor 304 require a minimum of 4 mA to operate, the current limiter 310 may limit the current to 5 mA. Assuming the pull-up resistors R1 214 and R2 216 are 1K ohm each and that the voltage source (V+) 212 input is +15 volts, the approximate "high" voltage level at either the first (NC) terminal 206 or second (NO) terminal 208 would be 15−(0.005*1000)=10 volts (assuming negligible conduction in Q1 306 and Q2 308). Then, assuming that the approximate conducting resistance of Q1 306 and Q2 308 is about 10 ohms, the approximate "low" voltage level at either the first (NC) terminal 206 or second (NO) terminal 208 would be 15*(10/1010)=0.15 volts.

Figure 4:
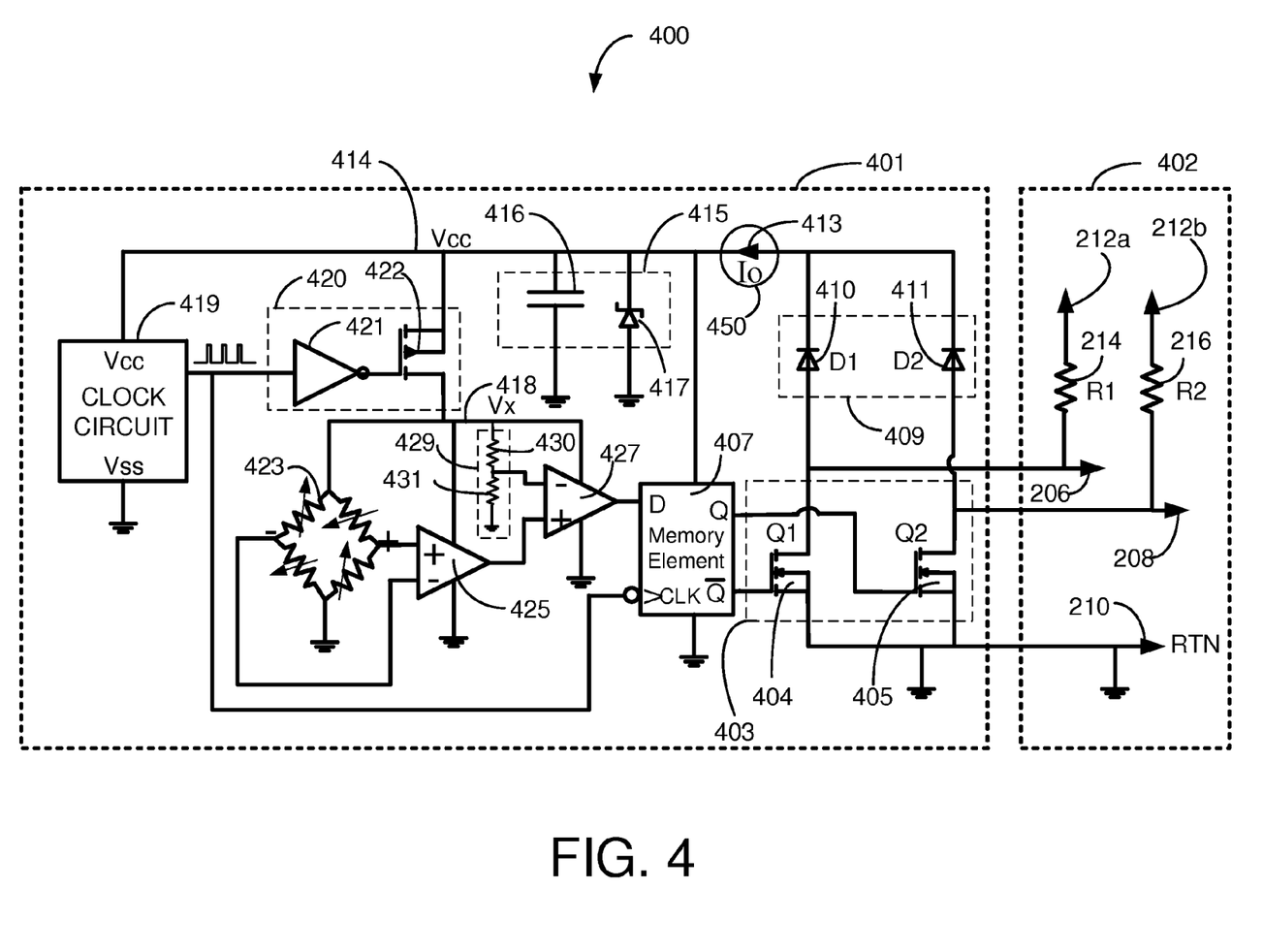
FIG. 4 illustrates an example embodiment of a switch system 400 adapted to replace a mechanical switch in accordance with various aspects set forth herein.

FIG. 4 illustrates an example embodiment of a switch system 400 having an electronic switching section 401 and three-lead interface section 402. In certain example implementations, the system 400 may be adapted to replace a mechanical switch in accordance with various aspects set forth herein. According to an example implementation of the disclosed technology, three-lead interface section 402 may include the same terminals 206 208 210, pull-up resistors 214 216, and supply voltages 212(*a, b*) as described above with reference to FIG. 2 and FIG. 3. In certain example implementations, the electronic switching section 401 may perform a similar single pole double throw (SPDT) as previously described above with reference to FIG. 3. As will be explained below, uninterrupted power may be provided to the components of the electronic switching section 401 via the terminals 206 208 210, pull-up resistors 214 216, and supply voltages 212(*a, b*) without requiring separate power leads. Thus, certain example implementations, the system 400 may be adapted to replace a mechanical switch without requiring additional wiring.

In an example implementation, the electronic switch system 401 may be configured to include one or more of: a switching output circuit 403, a memory element 407 (such as a flip-flop), a current control circuit 409, a current limiter circuit 450, a voltage regulation circuit 415, a first derived voltage Vcc 414 a clock circuit 419, a clock-controlled voltage source circuit 420, a second derived voltage Vx 418, a sensor 423, an amplifier 425, a comparator 427, and a comparator voltage reference circuit 429. In an example implementation, the three-lead interface section 402 may include a first terminal 206 such as may be associated with a normally closed (NC) lead, a second terminal 208, such as may be associated with a normally open (NO) lead, and a return (ground) terminal 210 (as previously described with respect to FIG. 2 and FIG. 3 above). The three-lead electronic switch system 401 may represent a single pole double throw (SPDT) switch without the need for an additional supply voltage.

According to an example implementation of the disclosed technology, the electronic switching section 401 may replace a mechanical switch, for example, that would be in connected to the three lead interface section 402 by terminals 206, 208, 210. The first (NC) terminal 206 may be used to couple to a normally closed "switch" connection of the three lead interface section 402. Further, the second (NO) terminal 208 may be used to couple to a normally open "switch" connection of the three lead interface section 402. Finally, the ground terminal 210 may be used to couple to a return connection of the three lead interface section 402.

In an example implementation, the three lead interface section 402 may provide current from a first input voltage 212*a* to the electronic switching section 401 through a first pull-up resistor R1 214 to the first (NC) terminal 206. In one example, the first input voltage 212*a* may be about fifteen volts (15 V). In another example, the first pull-up resistor 214 may have a resistance of about two kilo-Ohms (2 kΩ). Similarly, the three lead interface section 402 may provide current from a second input voltage 212*b* to the electronic switching section 401 through a second pull-up resistor R2 216 to the second (NO) terminal 208. In one example, the second input voltage 212*b* may be about fifteen volts (15 V). In one example implementation, the second pull-up resistor R2 216 may have a resistance of about two kilo-Ohms (2 kΩ). Those of skill in the art will recognize that the selection of the input voltages 212*a* 212*b* and the values of the first and second pull-up resistors 214 216 may be chosen to provide for the voltage and current requirements of components in the electronic switching section 401 while mindful of leakage currents. Thus, the input voltages and pull-up resistor values described here are example only and should in no way limit the scope of the disclosed technology. It is a common design technique that is well-known in the art to use a pull-up resistor with electronic circuits.

In an example implementation, the switch output circuit 403 may be configured to include a first switch 404 (Q1) and a second switch 405 (Q2). In one example, each of the first switch 404 and the second switch 405 may be an N-channel MOSFET. In other example implementations, the first switch 404 and/or the second switch 405 may be transistors of various types, as appropriate and as known by those having skill in the art.

In one example implementation, the first switch 404 may be controlled by a first output of the memory element 407. Similarly, the second switch 405 may be controlled by a second output of the memory element 405. The first output of the memory element 407 may be complementary to the second output of the memory element 407. In one example, the memory element 407 may be a flip-flop, a latch, or the like. In one example, the memory element 407 may be a D-type complementary metal oxide semiconductor (CMOS) flip-flop. A person of ordinary skill in the art will recognize various techniques and trade-offs associated with the design of switch circuits.

In FIG. 4, the current control circuit 409 may be configured to include a first diode 410 (D1) and a second diode 411 (D2). In one example implementation, each of the first diode 410 and the second diode 411 may be a rectifier diode. The first diode 410 may be used to prevent the output of the first switch 404 operating in an active state from interfering with the second switch 405 operating in an inactive state from where the charging current 413 ($I_0$) is drawn. Similarly, the second diode 411 may be used to prevent the output of the second switch 405 operating in an active state from interfering with the first switch 404 operating in an inactive state from where the charging current 413 ($I_0$) is drawn. The first diode 410 may be used to draw the charging current 413 ($I_0$) from an output of the first switch 404. Similarly, the second diode 411 may be used to draw the charging current 413 ($I_0$) from an output of the second switch 405. It is important to note that the first switch 404 may be in an active state while the second switch 405 may be in an inactive state and vice versa. During steady-state operation, the first switch 404 and the second switch 405 may be in opposite states.

According to an example implementation of the disclosed technology, the first switch 404 may have an output coupled to the first terminal 206, which may also be referred to as switch normally closed (NC) connection. An output of the first switch 404 may also be coupled to a current limiter circuit 450 via the first diode 410 of the current control circuit 409. The second switch 405 may have an output coupled to the second terminal 208, which may also be referred to as switch normally open (NO) connection. An output of the second switch 404 may also be coupled to the current limiter circuit 413 via the second diode 411 of the current control circuit 409. The ground terminal 210 may be coupled to ground of the three-lead electronic switch system 400. Further, the ground terminal 210 may also be referred to as a return (RTN) connection. A person of ordinary skill in the art will recognize various techniques and trade-offs associated with the design of current control circuits.

In an example implementation, the current limiter circuit 450 may control a magnitude of a charging current 413 ($I_0$) such that the charging current 413 ($I_0$) may be lower than a predetermined leakage current such as a maximum allowed leakage current. A person of ordinary skill in the art will recognize various techniques and trade-offs associated with the design of current limiter circuits. The charging current 413 ($I_0$) output from the current limiter circuit 450 may be used to charge the voltage regulation circuit 415. The voltage regulation circuit 415, for example, may be used to provide a first derived voltage 414 ($V_{CC}$) to various components of the electronic switch section 401. In one example, the first derived voltage 414 ($V_{CC}$) may be about five volts (5 V). The voltage regulation circuit 415 may be configured to include a capacitor 416 such as a storage capacitor and/or a voltage regulator 417 such as a five volt (5V) Zener diode. In one example, the voltage regulator 417 may regulate the voltage at about five volts (5 V). The first derived voltage 414 ($V_{CC}$) may supply, for instance, the clock circuit 419, a second derived voltage source 418 ($V_X$), the memory element 407, or any combination thereof. The capacitor 416 may be charged by the charging current 413 ($I_0$) and, once about charged, may provide the first derived voltage 414 ($V_{CC}$). It should be noted that CMOS circuits may consume less current from the first derived voltage 414 ($V_{CC}$) than the charging current 413 as supplied by the current limiting circuit 450. A person of ordinary skill in the art will recognize various techniques and trade-offs associated with the design of voltage sources.

In FIG. 4, the clock circuit 419 may be used to generate a clock signal such as a low duty cycle pulse train. The clock circuit 419 may be configured to include an oscillator. The clock circuit 419 may use the first derived voltage 414 ($V_{CC}$) to generate a clock signal such as a sine wave, a square wave, a pulse train, or the like. The clock signal may be input to, for instance, the second derived voltage source 418 ($V_X$), and a clock input of the memory element 407. In one example, each clock cycle of the clock signal may be a pulse having a first duration at a first voltage and a second duration at a second voltage. In one example, the first duration of each clock cycle of the clock signal may be less than the second duration of each clock cycle of the clock signal. In another example, the first voltage of the clock signal may be a high-state voltage such as about five volts (5 V) and the second voltage of the clock signal may be a low-state voltage such as ground or about zero volts (0V). The capacitor 416 may be discharged during the first duration of each clock cycle of the clock signal due to the current consumption of the sensor 423, the amplifier 425, the comparator 427, the comparator voltage reference circuit 429, or any combination thereof. The capacitor 416 may be recharged by the charging current 413 ($I_0$) during the second duration of each clock cycle of the clock signal, which may be longer than the first duration of each clock cycle of the clock signal. A person of ordinary skill in the art will recognize various techniques and trade-offs associated with the design of clock circuits.

In this embodiment, the second derived voltage source 418 ($V_X$) may be configured to include an inverter 421 and a third switch 422. The second derived voltage source 418 ($V_X$) may provide voltage/signal to the sensor 423, the amplifier 425, the comparator 427, the comparator voltage reference circuit 429, or any combination thereof. The inverter 421 may invert the clock signal to drive an input of the third switch 422 to switch on the second derived voltage source 418 ($V_X$) during the first duration of each clock cycle of the clock signal and to switch off the second derived voltage source 418 ($V_X$) during the second duration of each clock cycle of the clock signal. In one example, the second derived voltage source 418 ($V_X$) may be less than the first derived supply voltage ($V_{CC}$). In another example, the second derived voltage source 418 ($V_x$) may be about four volts (4 V). In another example, the third switch 422 may be a P-channel MOSFET.

In accordance with an example implementation, the sensor 423, the amplifier 425, the comparator 427, the comparator voltage reference circuit 429, or any combination thereof may be in a first state during the first duration of each clock cycle of the clock signal and in a second state during the second duration of each clock cycle of the clock signal. In one example, the first state may be an active state and the second state may be an inactive state. It is important to note that the sensor 423, amplifier 425, the comparator 427, the comparator voltage reference circuit 429, or any combination thereof may consume more current during the first duration of each clock cycle of the clock signal than during the second duration of each clock cycle of the clock signal. A person of ordinary skill in the art will recognize various techniques and trade-offs associated with the design of switched voltage sources.

In FIG. 4, during the first duration of each clock cycle of the clock signal, the capacitor 416 may discharge at a high rate for a short time due to the current consumption of the sensor 423, the amplifier 425, the comparator 427, or any combination thereof resulting in the first derived supply voltage 414 ($V_{CC}$) sagging or dropping by a small amount. During the second duration of each clock cycle of the clock signal, the charging current 413 ($I_0$) may charge the capacitor returning the first derived supply voltage 414 ($V_{CC}$) to about its original voltage level prior to the discharge. Further, during the second duration of each clock cycle of the clock signal, the only current consumption from the voltage regulator circuit 415 may be by, for instance, the clock circuit 419 and the memory element 407. The current consumption of the clock circuit 419 or the memory element 407 may be less than the charging current 413 ($I_0$).

In an example implementation, the sensor 423 may sense an environmental condition, may convert the environmental condition into a sensed signal, and may output the sensed signal. The amplifier 425 may receive the sensed signal, may adjust a magnitude of the sensed signal, and may output an amplified sensed signal to the comparator 427. The comparator voltage reference circuit 429 may be configured to include a first resistor 206 and a second resistor 208. The comparator voltage reference circuit 429 may be used to provide a reference voltage to the comparator 427. The first resistor 430 and the second resistor 431 may be used to divide the second derived voltage source 418 ($V_x$) in generating the reference voltage for the comparator 427. The comparator 427 may receive the amplified sensed signal, may compare the amplified sensed signal to the reference signal, and may output a control signal determined by the comparison. In one example, if the amplified sensed signal is at least the reference signal, then the comparator 427 may output the control signal at a third voltage such as a high voltage. Alternatively, if the amplified sensed signal is less than the reference signal, then the comparator may output the control signal at a fourth voltage such as a low voltage.

In FIG. 4, the control signal from the comparator 427 may be applied to a data input of the memory element 407. Further, the clock signal from the clock circuit 419 may be applied to the clock input of the memory element 407. In one example, the clock input of the memory element 407 may be configured as a negative-edge triggered input. A voltage level of the control signal may be stored by the memory element 407 at the trailing edge of each clock cycle of the clock signal. Each of the first output and the second output of the memory element 407 may be maintained at its current state until the trailing edge of the next clock cycle of the clock signal. Therefore, the state of the first switch 404 and the state of the second switch 405 may be maintained until the trailing edge of the next clock cycle of the clock signal.

In another embodiment, during the second duration of each clock cycle of the clock signal, the sensor 423, the amplifier 425, comparator 427, the reference voltage circuit 429, or any combination thereof may operate in an inactive state.

In another embodiment, during the second duration of each clock cycle of the clock signal, only the clock circuit 419, the second derived voltage source 418 ($V_x$) and the memory element 407 may be in an active state.

In another embodiment, the duty cycle of each clock cycle of the clock signal may be designed such that the capacitor 416 may be recharged during a worst case current consumption by the sensor 423, the amplifier 425, the comparator 427, the comparator voltage reference circuit 429, or any combination thereof.

In another embodiment, the discharge current from the capacitor 416 during the first duration of each clock cycle of the clock signal may be designed to be less than the worst case, and therefore the charging current 413 ($I_0$) may overcharge the capacitor 416. In order to avoid this overcharge, the voltage regulator 417 may be used to limit the first derived supply voltage 414 ($V_{CC}$) to about a voltage of the voltage regulator 417.

Figure 5:
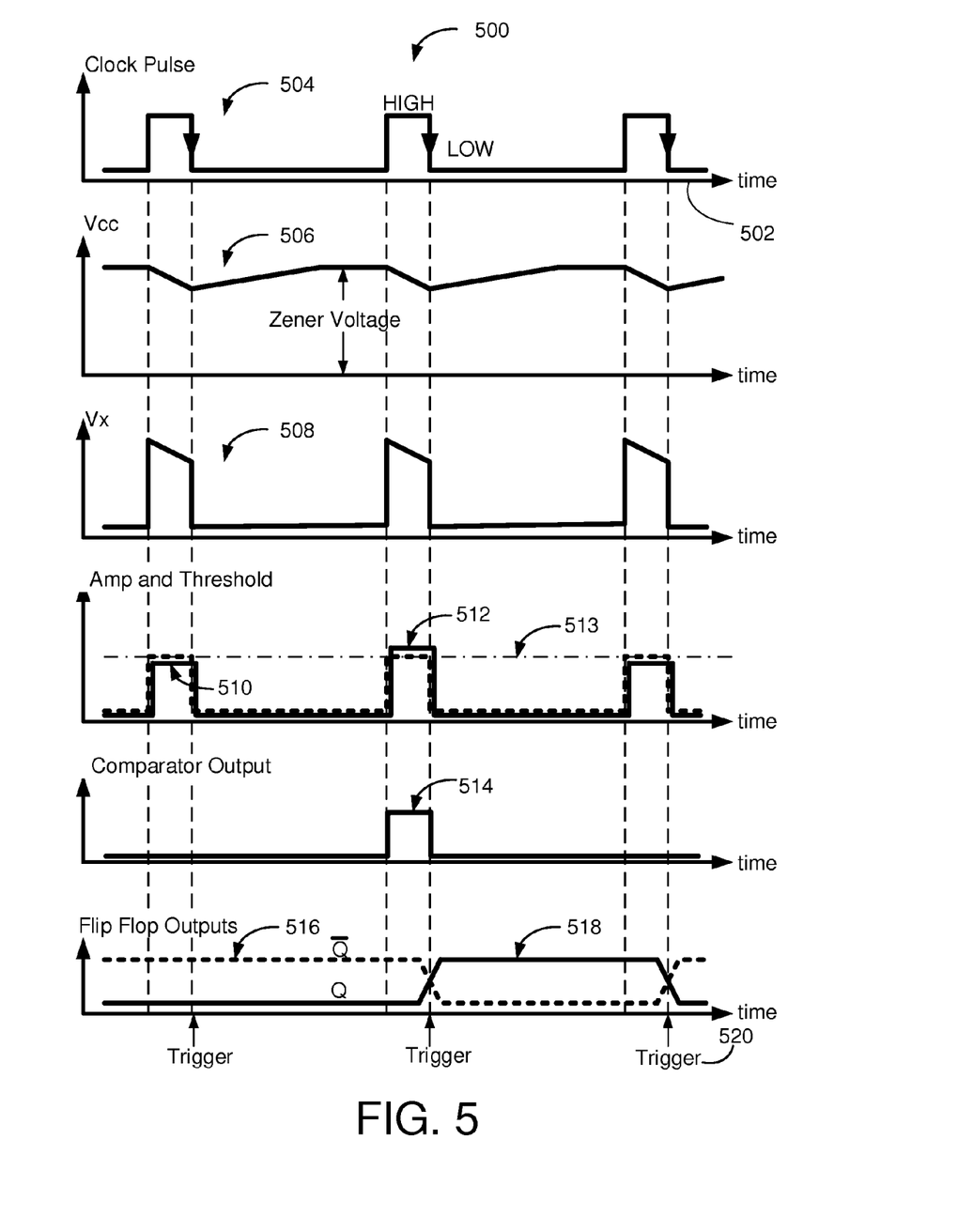
FIG. 5 is a chart 500 that depicts various illustrative signals 504 506 508 510 512 514 516 518 associated with an embodiment of a three-lead electronic switch system adapted to replace a mechanical switch in accordance with certain implementations of the disclosed technology.

FIG. 5 is a chart 500 that depicts illustrative waveforms 504-518 vs. time 502 in different points of an example circuit (such as the switch system 400 circuit as shown in FIG. 4) associated with a three-lead electronic switch system embodiment that is adapted, for example, to replace a mechanical switch. The time 502 duration illustrated in FIG. 5 corresponds approximately to three (3) clock pulses of the clock signal 504. Included in FIG. 5 is the clock signal 504 (which may correspond to the output of the clock circuit 419 in FIG. 4); Vcc 506 (which may correspond to the first derived supply voltage 414 of FIG. 4); Vx 508 (which may correspond to the second derived voltage source 418 of FIG. 4); amplifier output 512 and threshold 513 signals (which may respectively correspond to the output of the amplifier 425 and the comparator voltage reference circuit 429 of FIG. 4); the comparator output 514 (which may correspond to the output of the comparator 427 of FIG. 4); and the flip flop Q-not 516 and Q 518 outputs (which may correspond to the output of the memory element 407 of FIG. 4). Also shown in FIG. 5 are triggers 520 that correspond with the trailing (high to low) edge of the clock signal 504.

As depicted in FIG. 5, and with reference to the amplifier output 512 and threshold 513 waveforms, during the first duration of the first clock pulse of the clock signal 504, the environmental condition may be such that the amplifier output 512 is below the threshold 513, but, as illustrated, the amplifier output 512 may be above the threshold 513 during the second clock pulse HIGH duration. Then the amplifier output 512 is again below the threshold 513 during the third clock pulse HIGH duration. Correspondingly, the comparator output 514 is LOW during the first and third HIGH times of the clock signal 504 pulse, and HIGH during the second HIGH time of the clock signal 504. Assuming that the Q output 518 of the memory circuit (for example, the output of memory element 407 of FIG. 4) is initially LOW, it remains LOW after the first trailing edge trigger 520 and switches to HIGH after the second trigger 520, and back to LOW after the third trigger 520.

The example circuits depicted in FIG. 3 and FIG. 4, along with the associated illustrative waveforms 504-518 as depicted in FIG. 5, disclose illustrative embodiments of three-lead electronic switch systems that provide certain technical effects and/or advantages. For example, the sensor 423 element may be selected (or matched) to be responsive to certain environmental conditions or stimuli (such as pressure, force, temperature, etc.,) but the sensor 423 element alone may not be suitable for activating the NC or NO outputs for interfacing with external circuitry, for example, via the three-lead interface section 402.

Certain example implementations of the disclosed technology may provide the signal conditioning and/or isolation interface between the sensor 423 element and the three lead interface section 402. Further, the disclosed technology may provide the technical effect and/or advantage of the of reducing current draw associated with the switch system 400, for example, by virtue of the duty cycle operation of the electronic switching section 401, which in certain example implementations, may be controlled by the clock signal 504. For example, the sensor 423, the amplifier 425, and the comparator 427 may have periods of reduced current draw between clock pulses.

Another technical effect and/or advantage of the disclosed technology may include a sample-and-hold aspect of the electronic switching section 401, by virtue of the memory element 407 that latches the comparator output between falling edges of the clock pulses. In effect, this feature may effectively de-bounce the output so that unnecessary switching does not occur, for example due to noise, and so that the frequency of the output switching state (for example, the logic state at the NC lead 206 the NO lead 208) is less than or equal to the clock frequency.

Another technical effect and/or advantage of the disclosed technology may include isolating the opposite output states of the first switch 404 and the second switch 405 while powering the various components of the electronic switching section 401 via voltage source(s) 212a 212b and pull-up resistors 214 216. For example, the disclosed circuit configuration allows for powering the electronic switching section via paths associated with the switching elements 404 405 that are in a non-conducting state, thereby providing uninterrupted power to the electronic switching section 401 without requiring additional wiring.

Example embodiments of the disclosed technology include a device that includes a sensor, a current limiting circuit, an output switching circuit that includes a first switching device and a second switching device. The device also includes a three lead interface circuit in communication with the output switching circuit and the current limiting circuit. The three lead interface circuit includes a first terminal, a second terminal, and a return terminal. In an example implementation, the device also includes an electronic switching circuit in communication with the sensor, the current limiting circuit, and the output switching circuit. The electronic switching circuit is configured to operate the first switching device and the second switching device of the output switching circuit in a first state responsive to determining that an output of the sensor is less than a threshold voltage, an operate the first switching device and a the second switching device of the output switching circuit in a second state responsive to determining that the output of the sensor is at least the threshold voltage. The first state includes a conductive state of only one of the first switching device or the second switching device and a non-conductive state of the other switching device. The second state is complementary to the first state. The first terminal, the second terminal, and the return terminal are configured to provide power to the electronic switching circuit while providing an indication of the first state or the second state.

According to an example implementation of the disclosed technology, the current limiting circuit is configured to isolate an output of the first switching device from an output of the second switching device.

In an example implementation, the first switching device and a second switching device are driven by complementary outputs of the electronic switching circuit.

According to an example implementation of the disclosed technology, the first terminal of the three lead interface circuit is configured to receive a switch voltage used to provide power for the device through a first pull-up resistor, and the second terminal is configured to receive the switch voltage used to provide power for the device through a second pull-up resistor. The first terminal of the three lead interface circuit is in communication with the first switching device of the output switching circuit and the second terminal of the three lead interface circuit is in communication with the second switching device of the output switching circuit.

In certain example implementations, the electronic switching circuit includes a comparator, wherein the electronic switching circuit is further configured to determine, by the comparator, when the output of the sensor is less than the threshold voltage and when the output of the sensor is at least the threshold voltage.

According to an example implementation of the disclosed technology, the first terminal, the second terminal, and the return terminal are the only electronic connections to the device.

In certain example implementations, the sensor is used to measure a pressure. In certain example implementations, the sensor is used to measure a temperature. In certain example implementations, the sensor includes a bridge array having a sensing element. In various example implementations, the output of the bridge array is coupled to the input of the electronic switching circuit and the electronic switching circuit is further configured to toggle between the first state and the second state based on the output of the bridge array.

According to an example implementation of the disclosed technology, the bridge array includes a Wheatstone bridge. In certain example implementations, the bridge array includes a piezoresistive bridge.

According to an example implementation of the disclosed technology, the threshold voltage is associated with a predetermined pressure. According to an example implementation of the disclosed technology, the threshold voltage is associated with a predetermined temperature.

In accordance with an example implementation, the electronic switching circuit includes a clock circuit. In certain example implementations, the electronic switching circuit includes a memory element. In certain example implementations, the electronic switching circuit includes a comparator.

According to an example implementation of the disclosed technology, and responsive to determining the output of the sensor, the comparator outputs a first comparator voltage when the output of the sensor is less than the threshold voltage, and the comparator outputs a second comparator voltage when the output of the sensor is at least the threshold voltage.

In certain example implementations, the clock circuit is configured to output a clock signal and to provide power to the comparator circuit and the sensor at least during portions of the clock signal having a high state.

In certain example implementations, the memory element is configured to latch an output of the comparator based on the clock signal, and wherein the memory element is further configured to provide complementary latched outputs for driving the first switching device and the second switching device of the output switching circuit.

According to an example implementation of the disclosed technology, the electronic switching circuit comprises a voltage regulator. In certain example implementations, the voltage regulator can include a Zener diode. In certain example implementations, the electronic circuit further includes an amplifier, wherein the amplifier is configured to modify an amplitude of the output of the sensor prior to input to the comparator.

In accordance with an example implementation, current used by the device is substantially the same for the device operating in the first state and the second state.

It is important to recognize that it is impractical to describe every conceivable combination of components or methodologies for purposes of describing the claimed subject matter. However, a person having ordinary skill in the art will recognize that many further combinations and permutations of the subject technology are possible. Accordingly, the claimed subject matter is intended to cover all such alterations, modifications, and variations that are within the spirit and scope of the claimed subject matter.

Although the present disclosure describes specific examples, embodiments, and the like, various modifications and changes may be made without departing from the scope of the present disclosure as set forth in the claims below. For example, although the example methods, devices and systems, described herein are in conjunction with a configuration for the aforementioned three-lead electronic switch system adapted to replace a mechanical switch, the skilled artisan will readily recognize that the example methods, devices or systems may be used in other methods, devices or systems and may be configured to correspond to such other example methods, devices or systems as needed. Further, while at least one example, embodiment, or the like has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims. Any benefits, advantages, or solutions to problems that are described herein with regard to specific examples, embodiments, or the like are not intended to be construed as a critical, required, or essential feature or element of any or all of the claims.

I claim:

1. A device, comprising:
   a sensor;
   a current limiting circuit;
   an output switching circuit comprising a first switching device and a second switching device;
   a three lead interface circuit in communication with the output switching circuit and the current limiting circuit, the three lead interface circuit comprising a first terminal, a second terminal, and a return terminal;
   an electronic switching circuit in communication with the sensor, the current limiting circuit, and the output switching circuit, the electronic switching circuit is configured to:
   responsive to determining that an output of the sensor is less than a threshold voltage, operate the first switching device and the second switching device of the output switching circuit in a first state, and
   responsive to determining that the output of the sensor is at least the threshold voltage, operate the first switching device and a the second switching device of the output switching circuit in a second state, wherein the first state comprises a conductive state of only one of the first switching device or the second switching device and a non-conductive state of the other switching device, and wherein the second state is complementary to the first state;
   wherein the first terminal, the second terminal, and the return terminal are configured to provide power to the electronic switching circuit while providing an indication of the first state or the second state.

2. The device of claim 1, wherein the current limiting circuit is configured to isolate an output of the first switching device from an output of the second switching device.

3. The device of claim 1, wherein the first switching device and a second switching device are driven by complementary outputs of the electronic switching circuit.

4. The device of claim 1, wherein the first terminal of the three lead interface circuit is configured to receive a switch voltage used to provide power for the device through a first pull-up resistor, and the second terminal is configured to receive the switch voltage used to provide power for the device through a second pull-up resistor; wherein a first terminal of the three lead interface circuit is in communication with the first switching device of the output switching circuit and a second terminal of the three lead interface circuit is in communication with the second switching device of the output switching circuit.

5. The device of claim 1, wherein the electronic switching circuit includes a comparator, wherein the electronic switching circuit is further configured to determine, by the comparator, when the output of the sensor is less than the threshold voltage and when the output of the sensor is at least the threshold voltage.

6. The device of claim 1, wherein the first terminal, the second terminal, and the return terminal are the only electronic connections to the device.

7. The device of claim 1, wherein the sensor is used to measure a pressure.

8. The device of claim 1, wherein the sensor is used to measure a temperature.

9. The device of claim 1, wherein the sensor includes a bridge array having a sensing element.

10. The device of claim 9, wherein the output of the bridge array is coupled to the input of the electronic switching circuit and the electronic switching circuit is further configured to toggle between the first state and the second state based on the output of the bridge array.

11. The device of claim 9, the bridge array includes a Wheatstone bridge.

12. The device of claim 9, the bridge array includes a piezoresistive bridge.

13. The device of claim 1, wherein the threshold voltage is associated with a predetermined pressure.

14. The device of claim 1, wherein the threshold voltage is associated with a predetermined temperature.

15. The device of claim 1, wherein the electronic switching circuit comprises:
   a clock circuit;
   a memory element; and
   a comparator.

16. The device of claim 15, wherein responsive to determining the output of the sensor, the comparator outputs a first comparator voltage when the output of the sensor is less than the threshold voltage, and the comparator outputs a second comparator voltage when the output of the sensor is at least the threshold voltage.

17. The device of claim 15, wherein the clock circuit is configured to output a clock signal and to provide power to the comparator circuit and the sensor at least during portions of the clock signal having a high state.

18. The device of claim 15, wherein the memory element is configured to latch an output of the comparator based on the clock signal, and wherein the memory element is further configured to provide complementary latched outputs for driving the first switching device and the second switching device of the output switching circuit.

19. The device of claim 15, wherein the electronic switching circuit comprises a voltage regulator.

20. The device of claim 19, wherein the voltage regulator comprises a zener diode.

21. The device of claim 15, wherein the electronic circuit further includes an amplifier, wherein the amplifier is configured to modify an amplitude of the output of the sensor prior to input to the comparator.

22. The device of claim 1, wherein a current used by the device is substantially the same for the device operating in the first state and the second state.

* * * * *